(12) United States Patent
Phillips et al.

(10) Patent No.: US 11,621,526 B2
(45) Date of Patent: Apr. 4, 2023

(54) COMMUNICATION SYSTEM HAVING A RECEPTACLE CAGE WITH AN ELECTRICAL CONNECTOR

(71) Applicant: TE Connectivity Services GmbH, Schaffhausen (CH)

(72) Inventors: Michael John Phillips, Camp Hill, PA (US); Eric David Briant, Dillsburg, PA (US); Charles Jameson Valentine, Lancaster, PA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 143 days.

(21) Appl. No.: 17/316,774

(22) Filed: May 11, 2021

(65) Prior Publication Data

US 2022/0368082 A1    Nov. 17, 2022

(51) Int. Cl.
*H01R 12/71*     (2011.01)
*H01R 13/6583*   (2011.01)
*H05K 9/00*      (2006.01)
*H05K 7/20*      (2006.01)
*H01R 13/518*    (2006.01)

(52) U.S. Cl.
CPC ........ *H01R 13/6583* (2013.01); *H01R 12/716* (2013.01); *H01R 13/518* (2013.01); *H05K 7/20* (2013.01); *H05K 9/0058* (2013.01)

(58) Field of Classification Search
CPC .......................... H01R 13/6583; H01R 12/716; H01R 13/518; H05K 7/20; H05K 9/0058
See application file for complete search history.

(56) References Cited

U.S. PATENT DOCUMENTS

| | | | |
|---|---|---|---|
| 7,351,104 B2 | 4/2008 | Neer et al. | |
| 7,357,673 B2 | 4/2008 | Long | |
| 7,421,184 B2 | 9/2008 | Long | |
| 7,641,515 B1* | 1/2010 | Szczesny | H01R 13/6582 439/541.5 |
| 9,312,618 B2 | 4/2016 | Regnier et al. | |
| 9,608,377 B1* | 3/2017 | Phillips | H01R 13/7172 |
| 10,476,198 B1* | 11/2019 | Pogash | H01R 13/518 |
| 10,797,417 B2 | 10/2020 | Scholeno et al. | |
| 10,952,355 B1* | 3/2021 | Hocker | H05K 5/0247 |
| 2008/0299826 A1* | 12/2008 | Cheng | H01R 13/658 29/874 |
| 2010/0111476 A1* | 5/2010 | Shirk | H01R 13/7172 385/53 |

(Continued)

*Primary Examiner* — Abdullah A Riyami
*Assistant Examiner* — Nelson R. Burgos-Guntin

(57) ABSTRACT

A communication system having a circuit board with an airflow opening includes a receptacle cage configured to be mounted to the circuit board adjacent a communication connector. The receptacle cage has walls including a front wall, a rear wall and side walls defining a cavity. A module channel is defined in the cavity configured to receive a pluggable module. The module channel has a module port at the front wall that receives the pluggable module. An airflow channel is defined by at least one of the walls of the receptacle cage located between the module channel and the circuit board. The airflow channel is configured to be in flow communication with the airflow opening in the circuit board for cooling the pluggable module in the module channel. The airflow channel has an airflow port at the front wall.

20 Claims, 7 Drawing Sheets

(56) References Cited

U.S. PATENT DOCUMENTS

| | | | | |
|---|---|---|---|---|
| 2012/0196477 | A1* | 8/2012 | Nichols | H05K 9/0058 |
| | | | | 439/607.01 |
| 2013/0186681 | A1* | 7/2013 | Wickes | H05K 9/0009 |
| | | | | 174/382 |
| 2017/0054234 | A1* | 2/2017 | Kachlic | H01R 12/712 |
| 2017/0264052 | A1* | 9/2017 | Henry | H01R 13/6596 |
| 2019/0305468 | A1 | 10/2019 | Avery et al. | |
| 2019/0387650 | A1* | 12/2019 | Zhou | G02B 6/4261 |
| 2020/0274295 | A1* | 8/2020 | Briant | G02B 6/428 |
| 2020/0295498 | A1* | 9/2020 | Lloyd | H01R 13/502 |
| 2021/0022268 | A1* | 1/2021 | Sharf | F28F 3/025 |
| 2021/0126392 | A1* | 4/2021 | Briant | H01R 13/514 |
| 2021/0153385 | A1* | 5/2021 | Lu | H05K 7/20254 |
| 2021/0194173 | A1* | 6/2021 | Yang | H05K 9/0058 |
| 2021/0226361 | A1* | 7/2021 | Mason | H01R 13/6471 |
| 2021/0328384 | A1* | 10/2021 | Avery | H01R 12/71 |
| 2021/0400843 | A1* | 12/2021 | Yang | H05K 9/0058 |
| 2022/0085532 | A1* | 3/2022 | Costello | H01R 13/659 |
| 2022/0173546 | A1* | 6/2022 | Kao | H01R 13/514 |
| 2022/0360020 | A1* | 11/2022 | Morgan | H01R 13/6585 |
| 2022/0368082 | A1* | 11/2022 | Phillips | H01R 12/716 |

* cited by examiner

COMMUNICATION SYSTEM HAVING A RECEPTACLE CAGE WITH AN ELECTRICAL CONNECTOR

BACKGROUND OF THE INVENTION

The subject matter herein relates generally to communication systems.

Some communication systems utilize communication connectors to interconnect various components of the system for data communication. Some known communication systems use pluggable modules, such as I/O modules, that are electrically connected to the communication connector. Conventional communication systems have performance problems, particularly when transmitting at high data rates. Known communication systems provide electrical shielding, such as in the form of a receptacle cage surrounding the communication connector and the pluggable module to provide electrical shielding. However, overmating or undermating of the pluggable module with the communication connector may be problematic. For example, undermating may lead to improper electrical connection between the circuit card of the pluggable module. Overmating may lead to damage to the communication connector, such as stressing or breaking solder connections between the contacts of the communication connector and the circuit board. For example, when the pluggable modules interface with the communication connector, the loading force may stress the interface between the communication connector and the circuit board.

A need remains for a receptacle connector assembly that positions the pluggable modules for proper mating with the communication connector of the communication system.

BRIEF DESCRIPTION OF THE INVENTION

In one embodiment, a receptacle connector assembly is provided and includes a receptacle cage configured to be mounted to a circuit board. The receptacle cage has walls includes a top wall, a rear wall and side walls defining a cavity. The cavity includes an upper module channel configured to receive an upper pluggable module and a lower module channel configured to receive a lower pluggable module. The receptacle cage has a channel separator between the upper module channel and the lower module channel. The receptacle cage has an upper module stop extending into the upper module channel to locate the upper pluggable module in the upper module channel. The receptacle connector includes an electrical connector assembly configured to be mounted to the circuit board. The electrical connector assembly received in the cavity proximate to the rear wall. The electrical connector assembly includes a housing holding upper contacts and lower contacts. The housing has an upper card slot and a lower card slot. The upper contacts are arranged in the upper card slot for mating with an upper circuit card of the upper pluggable module. The lower contacts are arranged in the lower card slot for mating with a lower circuit card of the lower pluggable module. The electrical connector assembly includes a lower module stop extending forward from the housing to locate the lower pluggable module in the lower module channel.

In another embodiment, an electrical connector assembly for electrically connecting upper and lower pluggable modules to a circuit board. The electrical connector assembly includes a housing having a bottom configured to be mounted to the circuit board. The housing has a front wall, an upper shroud extending forward of the front wall and a lower shroud extending forward of the front wall. The upper shroud configured to mate with the upper pluggable module. The lower shroud configured to mate with the lower pluggable module. The upper shroud has an upper card slot. The lower shroud has a lower card slot. The electrical connector assembly includes upper contacts held by the housing. The upper contacts are arranged in the upper card slot for mating with an upper circuit card of the upper pluggable module. The electrical connector assembly includes lower contacts held by the housing. The lower contacts are arranged in the lower card slot for mating with a lower circuit card of the lower pluggable module. The electrical connector assembly includes a lower module stop coupled to the front wall and extending forward from the front wall to a front stop tab. The front stop tab is located a stop distance from the front wall to locate the lower pluggable module relative to the front wall.

In a further embodiment, a communication system is provided and includes an upper pluggable module has an upper circuit card. The communication system includes a lower pluggable module having a lower circuit card. The communication system includes a circuit board having a cage mounting area and a connector mounting area. The communication system includes an electrical connector assembly configured to electrically connect the upper pluggable module and the lower pluggable module to the circuit board. The electrical connector assembly includes a housing holding upper contacts and lower contacts. The housing has a bottom mounted to the circuit board. The housing has a front wall, an upper shroud extending forward of the front wall and a lower shroud extending forward of the front wall. The upper shroud configured to mate with an upper pluggable module. The lower shroud configured to mate with a lower pluggable module. The upper shroud has an upper card slot. The lower shroud has a lower card slot. The upper contacts arranged in the upper card slot for mating with an upper circuit card of the upper pluggable module. The communication system includes a receptacle cage mounted to the circuit board. The receptacle cage has walls includes a top wall, a rear wall and side walls defining a cavity. The cavity includes an upper module channel receiving the upper pluggable module and a lower module channel receiving the lower pluggable module. The receptacle cage has a channel separator between the upper module channel and the lower module channel. The receptacle cage has an upper module stop extending into the upper module channel to locate the upper pluggable module in the upper module channel. The communication system includes a lower module stop coupled to the front wall of the housing and extending forward from the front wall to a front stop tab. The front stop tab located a stop distance from the front wall to locate the lower pluggable module in the lower module channel.

DETAILED DESCRIPTION OF THE INVENTION

Figure 1:
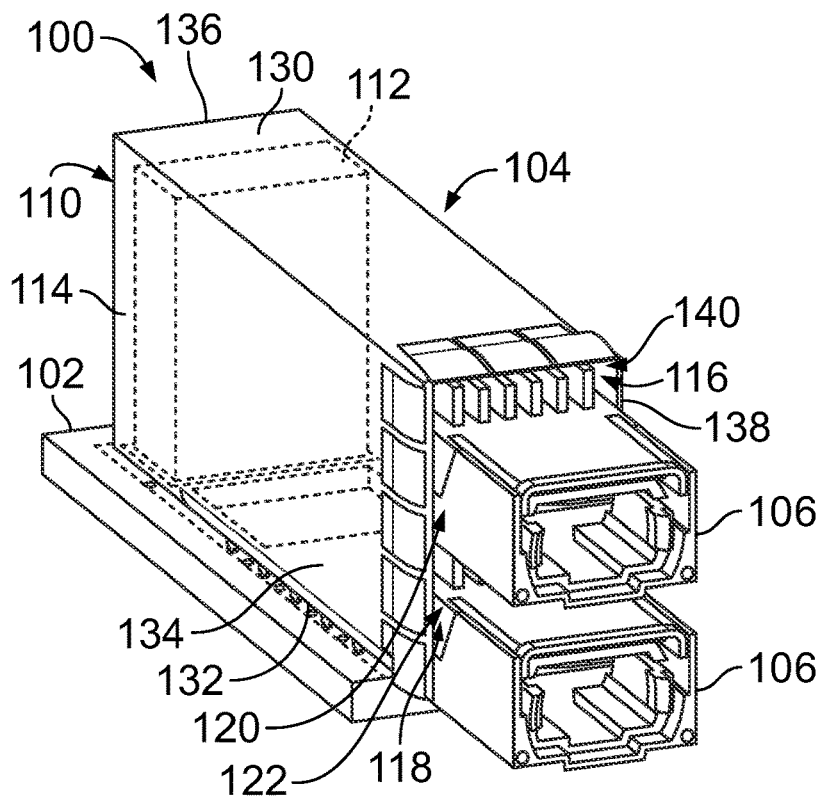
FIG. 1 is a front perspective view of communication system formed in accordance with an exemplary embodiment.
Figure 2:
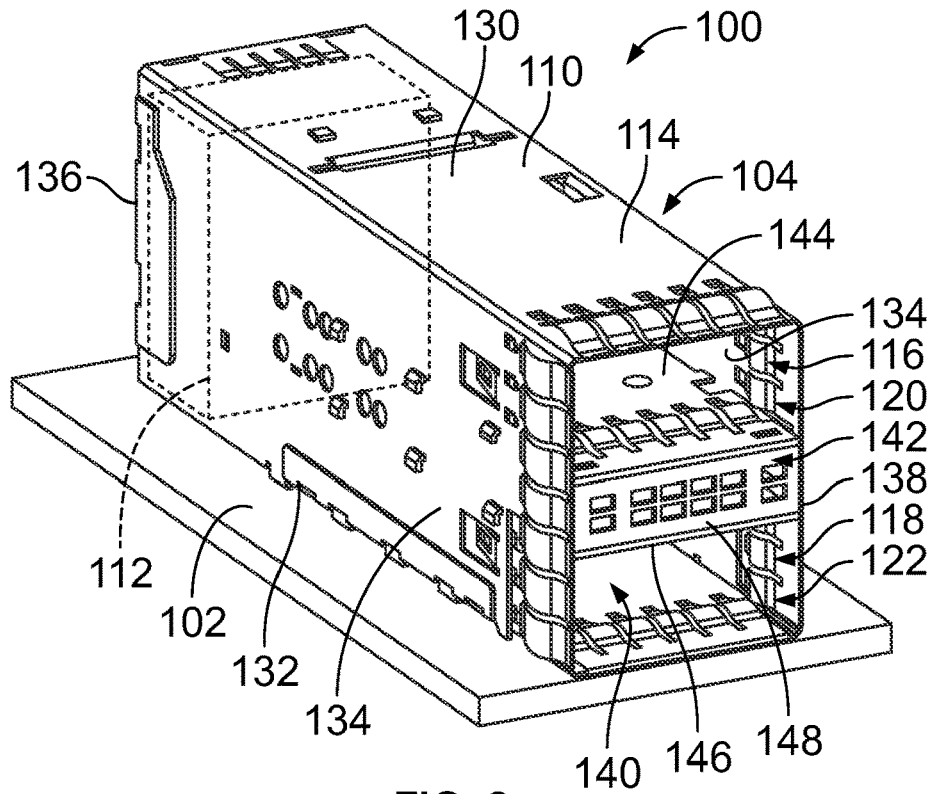
FIG. 2 is a front perspective view of a portion of the communication system formed in accordance with an exemplary embodiment.

FIG. 1 is a front perspective view of communication system 100 formed in accordance with an exemplary embodiment. FIG. 2 is a front perspective view of a portion of the communication system 100 formed in accordance with an exemplary embodiment. The communication system 100 includes a circuit board 102 and a receptacle connector assembly 104 mounted to the circuit board 102. Pluggable modules 106 are configured to be electrically connected to the receptacle connector assembly 104. The pluggable modules 106 are electrically connected to the circuit board 102 through the receptacle connector assembly 104. The pluggable modules 106 are shown in FIG. 1, but are removed in FIG. 2 to illustrate the receptacle connector assembly 104.

In an exemplary embodiment, the receptacle connector assembly 104 includes a receptacle cage 110 and an electrical connector assembly 112 (shown in phantom in FIGS. 1 and 2) adjacent the receptacle cage 110. For example, in the illustrated embodiment, the electrical connector assembly 112 is received in the receptacle cage 110. In other various embodiments, the electrical connector assembly 112 may be located rearward of the receptacle cage 110. In various embodiments, the receptacle cage 110 is enclosed and provides electrical shielding for the electrical connector assembly 112. The pluggable modules 106 are loaded into the receptacle cage 110 and are at least partially surrounded by the receptacle cage 110. The receptacle cage 110 includes a plurality of walls 114 that define one or more module channels for receipt of corresponding pluggable modules 106. The walls 114 may be walls defined by solid sheets, perforated walls to allow airflow therethrough, walls with cutouts, such as for a heatsink or heat spreader to pass therethrough, or walls defined by rails or beams with relatively large openings, such as for airflow therethrough. In an exemplary embodiment, the receptacle cage 110 is a shielding, stamped and formed metallic cage member with the walls 114 being shielding walls 114. In other embodiments, the receptacle cage 110 may be open between frame members, such as rails or beams, to provide cooling airflow for the pluggable modules 106 with the frame members of the receptacle cage 110 defining guide tracks for guiding loading of the pluggable modules 106 into the receptacle cage 110.

In the illustrated embodiment, the receptacle cage 110 constitutes a stacked cage member having an upper module channel 116 and a lower module channel 118. The receptacle cage 110 has upper and lower module ports 120, 122 that open to the module channels 116, 118 that receive the pluggable modules 106. Any number of module channels may be provided in various embodiments. In the illustrated embodiment, the receptacle cage 110 includes the upper and lower module channels 116, 118 arranged in a single column, however, the receptacle cage 110 may include multiple columns of ganged module channels 116, 118 in alternative embodiments (for example, 2×2, 3×2, 4×2, 4×3, etc.). The receptacle connector assembly 104 is configured to mate with the pluggable modules 106 in both stacked module channels 116, 118. Optionally, multiple electrical connector assemblies 112 may be arranged within the receptacle cage 110, such as when multiple columns of module channels 116, 118 are provided.

In an exemplary embodiment, the walls 114 of the receptacle cage 110 include a top wall 130, a bottom wall 132, and side walls 134 extending between the top wall 130 and the bottom wall 132. The bottom wall 132 may rest on the circuit board 102. However, in alternative embodiments, the bottom wall 132 may be elevated a distance above the circuit board 102 defining a gap below the bottom wall 132, such as for airflow. In other various embodiments, the receptacle cage 110 may be provided without the bottom wall 132. Optionally, the walls 114 of the receptacle cage 110 may include a rear wall 136 and a front wall 138 at the front of the receptacle cage 110. The module ports 120, 122 are provided in the front wall 138. The walls 114 define a cavity 140. For example, the cavity 140 may be defined by the top wall 130, the bottom wall 132, the side walls 134, the rear wall 136 and the front wall 138.

In an exemplary embodiment, other walls 114 may separate or divide the cavity 140 into the various module channels 116, 118. For example, the walls 114 may include a channel separator 142 between the upper and lower module channels 116, 118. The channel separator 142 may form a space between the upper and lower module channels 116, 118, such as for airflow, for a heat sink, for routing light pipes, or for other purposes. For example, the channel separator 142 includes an upper panel 144, a lower panel 146 and a front panel 148 between the upper and lower panels 144, 146. In other various embodiments, the walls 114 may include a divider walls extending between the top wall 130 and the bottom wall 132 to separate ganged module channels from each other. The divider walls are parallel to the side walls 134.

In an exemplary embodiment, the receptacle cage 110 may include one or more gaskets at the front wall 138 for providing electrical shielding for the module channels 116, 118. For example, the gaskets may be configured to electrically connect with the pluggable modules 106 received in the corresponding module channels 116, 118. The gaskets may be configured to electrically connect to a panel or bezel.

In an exemplary embodiment, the receptacle connector assembly 104 may include one or more heat sinks for dissipating heat from the pluggable modules 106. For example, the heat sink may be coupled to the top wall 130 for engaging the upper pluggable module 106 received in the upper module channel 116. The heat sink may extend through an opening in the top wall 130 to directly engage the pluggable module 106. Other types of heat sinks may be provided in alternative embodiments.

In an exemplary embodiment, the electrical connector assembly 112 is received in the cavity 140, such as proximate to the rear wall 136. However, in alternative embodiments, the electrical connector assembly 112 may be located behind the rear wall 136 exterior of the receptacle cage 110 and extend into the cavity 140 to interface with the pluggable module(s) 106. In an exemplary embodiment, a single electrical connector assembly 112 is used to electrically connect with the pair of stacked pluggable modules 106 in the upper and lower module channels 116, 118. In alternative embodiments, the communication system 100 may include discrete, stacked electrical connector assemblies 112 (for example, an upper communication connector and a lower communication connector) for mating with the corresponding pluggable modules 106.

In an exemplary embodiment, the pluggable modules 106 are loaded through the front wall 138 to mate with the electrical connector assembly 112. The shielding walls 114 of the receptacle cage 110 provide electrical shielding around the electrical connector assembly 112 and the pluggable modules 106, such as around the mating interfaces between the electrical connector assembly 112 and the pluggable modules 106.

Figure 3:
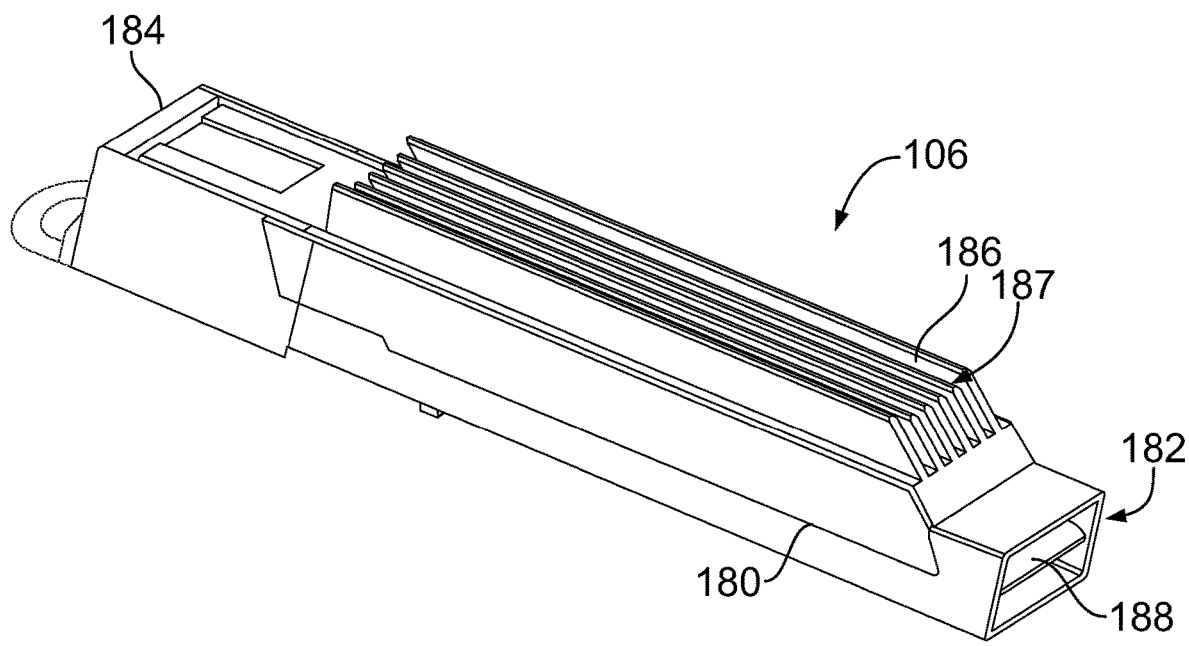
FIG. 3 is a rear perspective view of the pluggable module in accordance with an exemplary embodiment.

FIG. 3 is a rear perspective view of the pluggable module 106 in accordance with an exemplary embodiment. The pluggable module 106 has a pluggable body 180, which may be defined by one or more shells. The pluggable body may be thermally conductive and/or may be electrically conductive, such as to provide EMI shielding for the pluggable module 106. The pluggable body 180 includes a mating end 182 and an opposite front end 184. The mating end 182 is configured to be inserted into the corresponding module channel 116 or 118 (shown in FIG. 1). The front end 184 may be a cable end having a cable extending therefrom to another component within the system.

The pluggable module 106 includes a module circuit board 188 that is configured to be communicatively coupled to the electrical connector assembly 112 (shown in FIG. 1). The module circuit board 188 may be accessible at the mating end 182. The module circuit board 188 may include components, circuits and the like used for operating and or using the pluggable module 106. For example, the module circuit board 188 may have conductors, traces, pads, electronics, sensors, controllers, switches, inputs, outputs, and the like associated with the module circuit board 188, which may be mounted to the module circuit board 188, to form various circuits.

In an exemplary embodiment, the pluggable body 180 provides heat transfer for the module circuit board 188, such as for the electronic components on the module circuit board 188. For example, the module circuit board 188 is in thermal communication with the pluggable body 180 and the pluggable body 180 transfers heat from the module circuit board 188. In an exemplary embodiment, the pluggable body 180 includes a plurality of heat transfer fins 186 along at least a portion of the outer perimeter of the pluggable module 106. The fins 186 transfer heat away from the main shell of the pluggable body 180, and thus from the module circuit board 188 and associated components. The fins 186 are separated by gaps 187 that allow airflow or other cooling flow along the surfaces of the fins 186 to dissipate the heat therefrom. In the illustrated embodiment, the fins 186 are parallel plates that extend lengthwise; however the fins 186 may have other shapes in alternative embodiments, such as cylindrical or other shaped posts.

Figure 4:
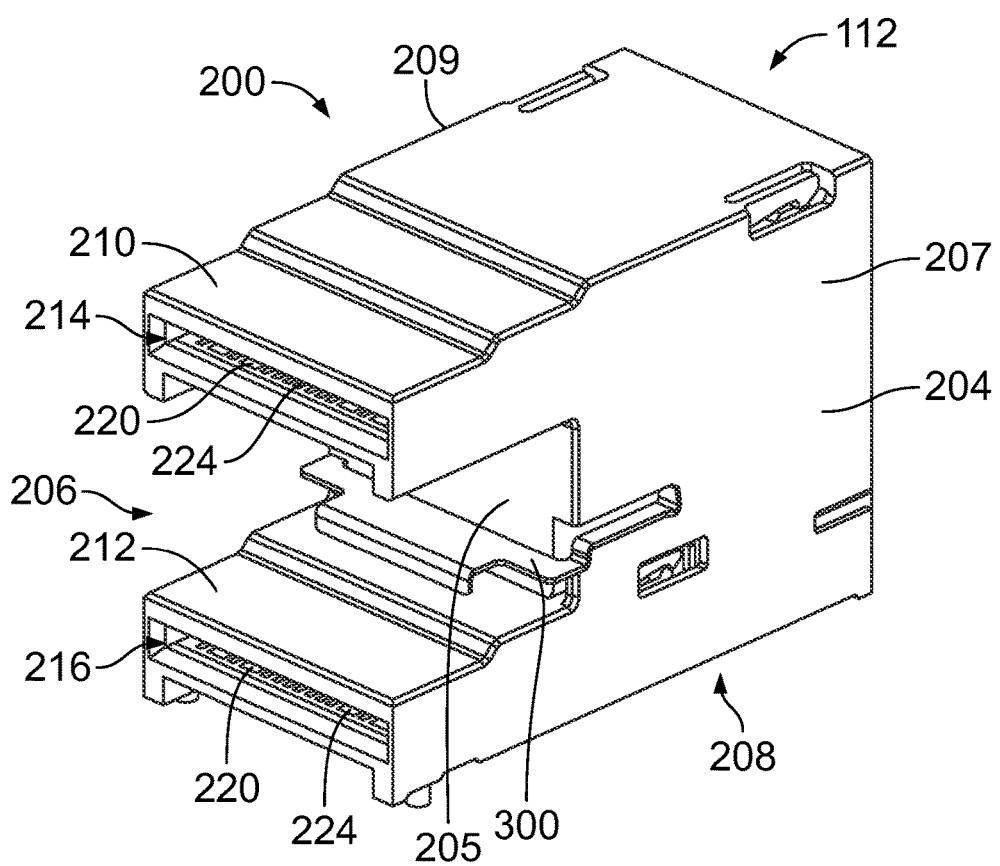
FIG. 4 is a front perspective view of the electrical connector assembly in accordance with an exemplary embodiment.
Figure 5:
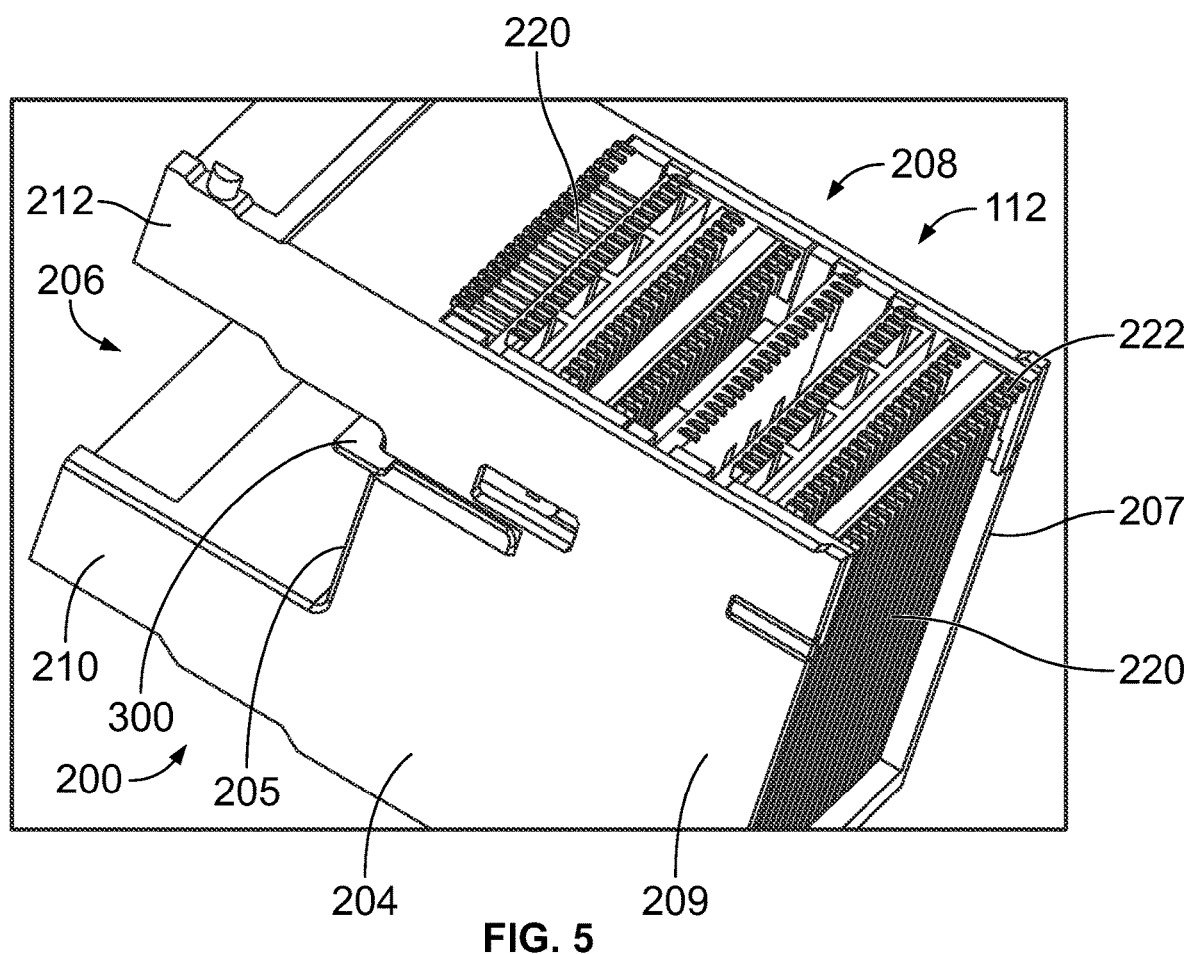
FIG. 5 is a bottom perspective view of the electrical connector assembly in accordance with an exemplary embodiment.

FIG. 4 is a front perspective view of the electrical connector assembly 112 in accordance with an exemplary embodiment. FIG. 5 is a bottom perspective view of the electrical connector assembly 112 in accordance with an exemplary embodiment. The electrical connector assembly 112 includes a housing 200 holding a plurality of contacts 220. In an exemplary embodiment, the contacts 220 may be held by contact holders 222 received in the housing 200. In alternative embodiments, the contacts 220 may be parts of contact modules that are arranged in a contact module stack that is loaded into the housing 200.

The housing 200 is defined by an upstanding body portion 204 having a mating end at a front 206 of the upstanding body portion 204 and a mounting end at a bottom 208 of the body portion 204. The housing 200 includes first and second sides 207, 209 extending between the front 206 and the rear. The body portion 204 may be molded from a dielectric material, such as a plastic material, to form the housing 200. The housing 200 may be open at the bottom 208 or a rear to receive the contacts 220. In an alternative embodiment, rather than having a stack of contact modules, the housing 200 may hold individual contacts between the mating end and the mounting end configured to be mounted to the circuit board 102.

The housing 200 has a front wall 205 at the front 206. The front wall 205 is forward facing. The housing 200 includes an upper shroud 210 and a lower shroud 212 extending forward from the front wall 205 to define a stepped mating face. For a single port cage member, the electrical connector assembly 112 may only include a single extension portion. An upper card slot 214 is provided in the upper shroud 210 and a lower card slot 216 is provided in the lower shroud 212. The card slots 214, 216 receive mating components, such as plug connectors, card edges of circuit cards of the corresponding pluggable modules 106 (shown in FIG. 1), or another type of mating component.

The contact holders 222 position the contacts 220 in the housing 200 such that the contacts 220 are provided at the mating end and the mounting end. The contacts 220 have spring beams 224 at mating ends that extend into the card slots 214, 216 for mating with contact pads on the card edge of the corresponding pluggable module 106. The contacts 220 have tails 226 at mounting ends for termination to the circuit board 102. For example, the tails 226 may constitute solder tails configured to be surface mounted to the circuit board 102. Other types of tails 226 may be provided in alternative embodiments, such as compliant pins that are press-fit into plated vias of the circuit board 102. The contacts 220 may be signal contacts and/or ground contacts and/or power contacts.

In an exemplary embodiment, the electrical connector assembly 112 includes a lower module stop 300 coupled to the housing 200. The lower module stop 300 is used to locate the lower pluggable module 106 relative to the electrical connector assembly 112. The lower module stop 300 is provided at the front 206 of the housing 200.

Figure 6:
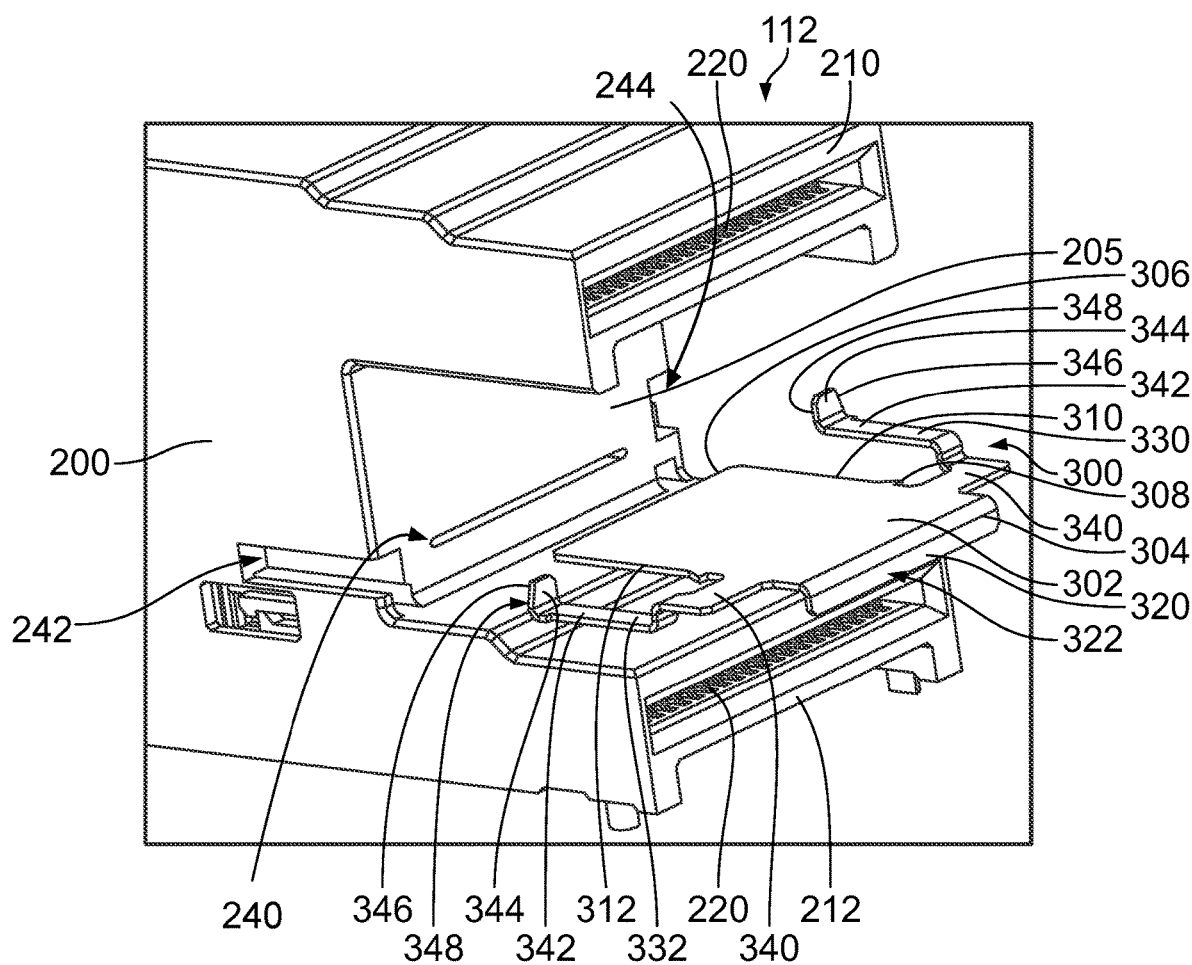
FIG. 6 is a front perspective, exploded view of a portion of the electrical connector assembly in accordance with an exemplary embodiment.

FIG. 6 is a front perspective, exploded view of a portion of the electrical connector assembly 112 in accordance with an exemplary embodiment. FIG. 6 illustrates the lower module stop 300 poised for mounting to the housing 200. In an exemplary embodiment, the housing 200 includes an opening 240 in the front wall 205. The opening 240 receives the lower module stop 300. The opening 240 is located along the front wall 205 between the upper shroud 210 and the lower shroud 212. In an exemplary embodiment, the housing 200 includes a first groove 242 at a first side of the housing 200 and a second groove 244 at a second side of the housing 200.

In an exemplary embodiment, the lower module stop 300 is stamped and formed from a metal sheet of material. For example, the lower module stop 300 may be manufactured from a steel material. The lower module stop 300 includes a main body 302 extending between a front 304 and a rear 306. The main body 302 is generally planar. For example, the main body 302 may be a plate. In the illustrated embodiment, the main body 302 is oriented horizontally.

Other orientations are possible in alternative embodiments the main body 302 is configured to be plugged into the opening 240 in the front wall 205 of the housing 200. In an exemplary embodiment, the lower module stop 300 includes retention features 308, such as barbs, extending from first and second sides 310, 312 of the main body 302. The retention features 308 are configured to engage the housing 200 to hold the lower module stop 300 in the housing 200. Other types of retention features may be provided in alternative embodiments.

The lower module stop 300 includes a front stop tab 320 at the front 304 of the main body 302. The front stop tab 320 includes a stop surface 322 configured to interface with the lower pluggable module 106 to locate the lower pluggable module 106 relative to the electrical connector assembly 112. The stop surface 322 is forward facing. The stop surface 322 provides a surface to interface with and stop the loading of the pluggable module 106 into the receptacle cage 110 to position the pluggable module 106 in the receptacle cage 110 relative to the electrical connector assembly 112. In the illustrated embodiment, the front stop tab 320 is bent generally perpendicular to the main body 302. For example, the front stop tab 320 may be bent downward. Alternatively, the front stop tab 320 may be bent upward or formed by a different process. For example, the front stop tab 320 may be welded to the main body 302.

The lower module stop 300 includes a first mounting arm 330 extending from the first side 310 and a second mounting arm 332 extending from the second side 312. The first mounting arm 330 is configured to be received in the first groove 242 along the first side of the housing 200 and the second mounting arm 332 is configured to be received in the second groove 244 along the second side of the housing 200. The mounting arms 330, 332 may be used to secure the lower module stop 300 to the housing 200. In an exemplary embodiment, the mounting arms 330, 332 are used to secure the lower module stop 300 to the receptacle cage 110. The mounting arms 330, 332 are used to transfer forces from the pluggable module to the receptacle cage 110 and thus reduce forces on the electrical connector assembly 112.

In an exemplary embodiment, the mounting arms 330, 332 are similar to each other. The mounting arms 330, 332 may be identical to each other and inverted on the opposite sides of the main body 302. The first mounting arm 330 is described in further detail below; however, the second mounting arm 332 may include like features, which may be referred to hereinafter with like reference numerals.

The mounting arm 330 includes an extension 340, a main beam 342, and a mounting tab 344. The extension 340 extends from the main body 302. The main beam 342 extends from the extension 340 to the mounting tab 344. The mounting tab 344 is provided at the distal end of the mounting arm 330. The mounting tab 344 is configured to be coupled to the receptacle cage 110 to fix the lower module stop 300 to the receptacle cage 110. In the illustrated embodiment, the extension 340 extends generally perpendicular from the side of the main body 302 and the main beam 342 extends generally perpendicular from the extension 340. Other orientations are possible in alternative embodiments. In the illustrated embodiment, the main beam 342 extends generally parallel to and spaced apart from the side of the main body 302. Other orientations are possible in alternative embodiments. The main beam 342 is deflectable relative to the main body 302. For example, the main beam 342 may be deflected toward the main body 302 when mating with the receptacle cage 110. In the illustrated embodiment, the mounting tab 344 is bent an angled relative to the main beam 342. For example, the mounting tab 344 may be bent generally perpendicular to the main beam 342. In the illustrated embodiment, the mounting tab 344 is bent upward. Other orientations are possible in alternative embodiments. In an exemplary embodiment, the mounting tab 344 includes a ramp 346 and an exterior edge of the mounting tab 344. The ramp 346 is configured to engage the receptacle cage 110 during assembly and deflect the mounting arm 330 inward toward the main body during assembly. In an exemplary embodiment, the mounting tab 344 includes a stop surface 348. The stop surface 348 is rearward facing in the illustrated embodiment. The stop surface 348 is configured to engage the receptacle cage 110 to transfer forces from the mounting arm 330 to the receptacle cage 110.

Figure 7:
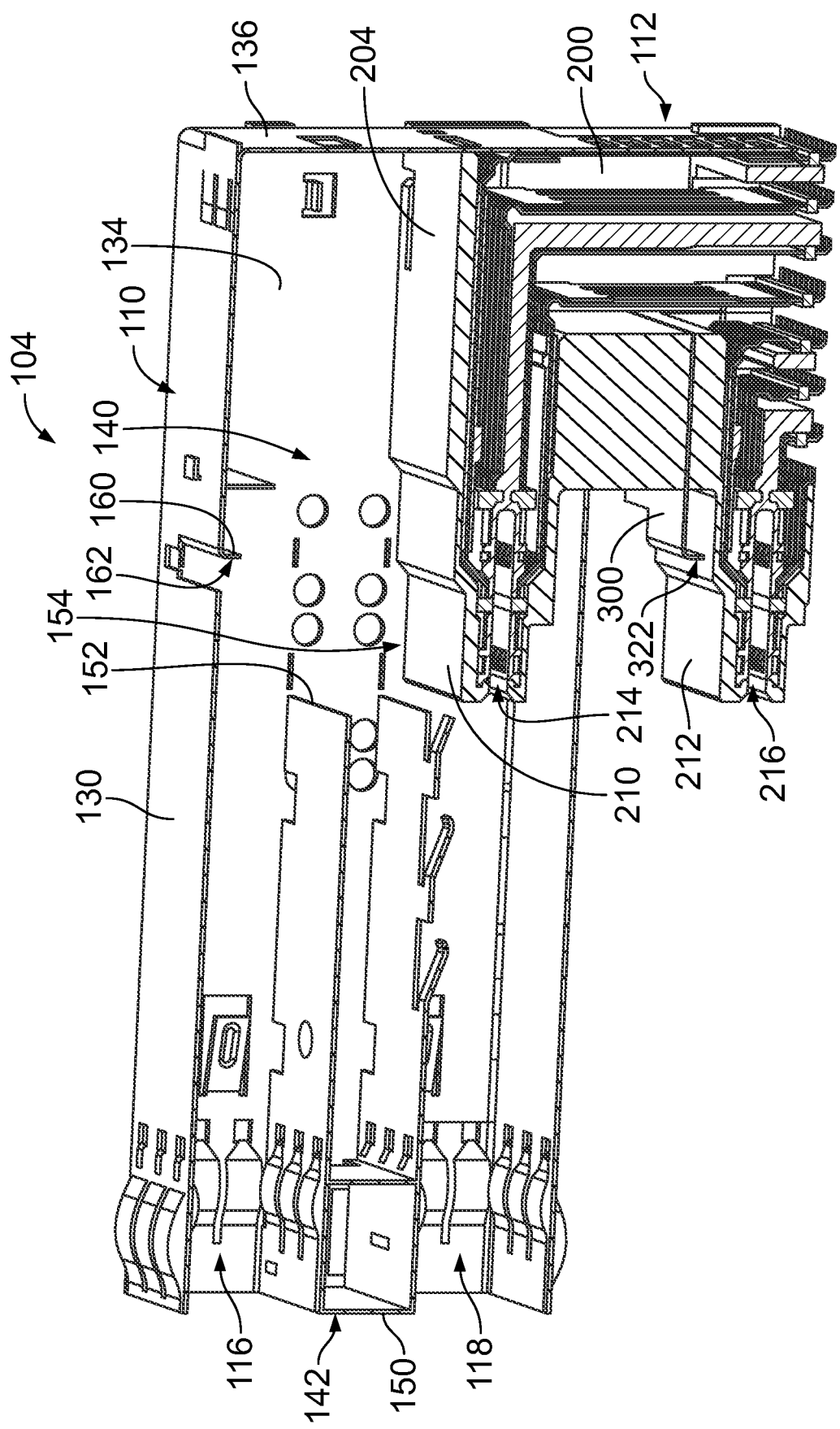
FIG. 7 is a cross-sectional view of a portion of the receptacle connector assembly in accordance with an exemplary embodiment.
Figure 8:
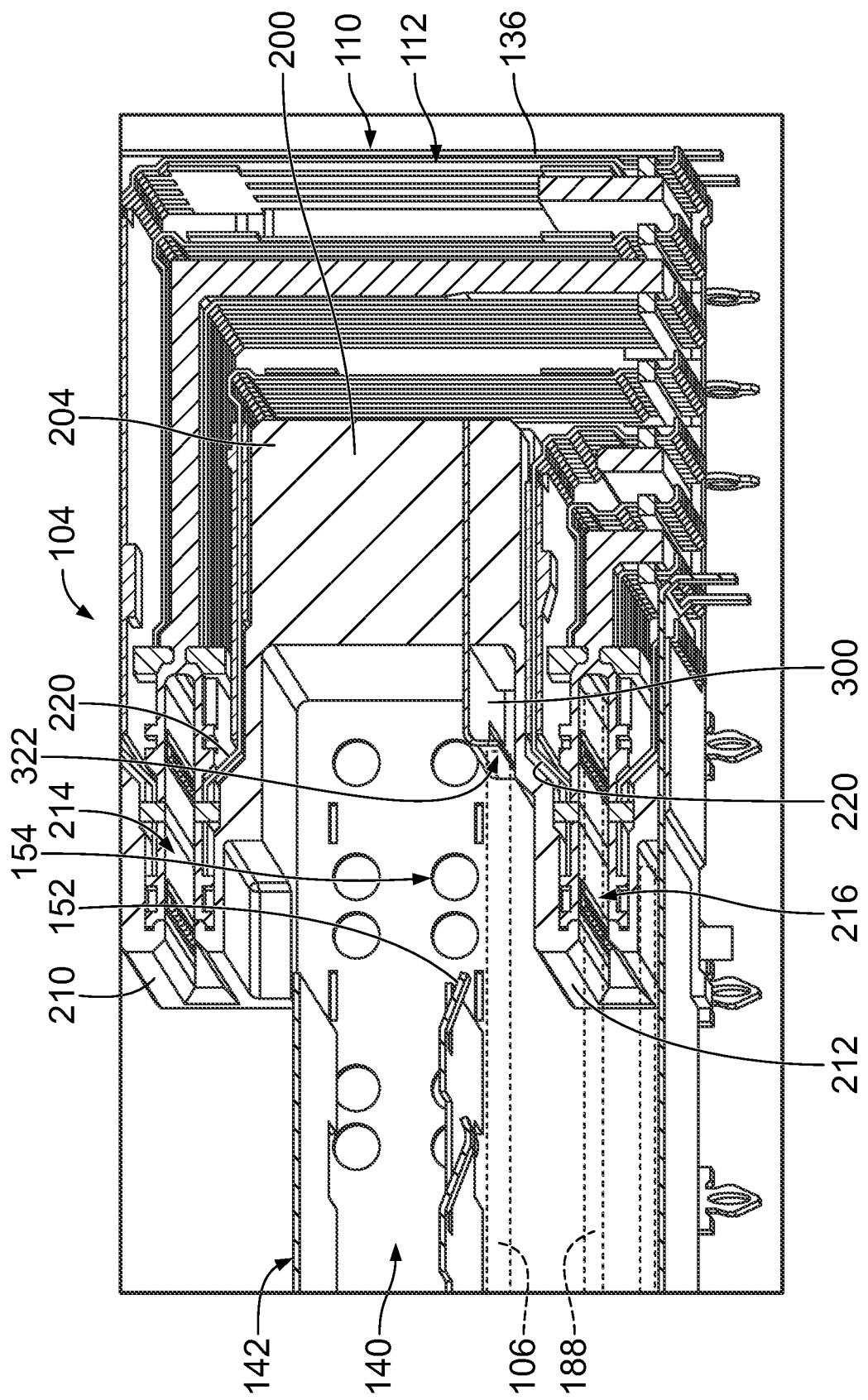
FIG. 8 is a cross-sectional view of a portion of the receptacle connector assembly in accordance with an exemplary embodiment.

FIG. 7 is a cross-sectional view of a portion of the receptacle connector assembly 104 in accordance with an exemplary embodiment showing the receptacle cage 110 partially coupled to the electrical connector assembly 112. FIG. 8 is a cross-sectional view of a portion of the receptacle connector assembly 104 in accordance with an exemplary embodiment showing the receptacle cage 110 coupled to the electrical connector assembly 112.

During assembly, the electrical connector assembly 112 is loaded into the cavity 140 of the receptacle cage 110. In an exemplary embodiment, the electrical connector assembly 112 is configured to be mounted to the circuit board 102 prior to loading into the cavity 140. For example, the contacts 220 may be soldered to the circuit board 102 prior to mounting the receptacle cage 110 to the circuit board 102 over the electrical connector assembly 112. In an exemplary embodiment, the channel separator 142 has a length between a front 150 and a rear 152 of the channel separator 142 that is less than a length of the side walls 134. An opening 154 is located rearward of the channel separator 142. The opening 154 extends between the channel separator 142 and the rear wall 136. The opening 154 receives the top of the electrical connector assembly 112 during assembly. For example, the upper portion of the body portion 204 and the upper shroud 210 pass through the opening 154 to align with the upper module channel 116. As such, the upper pluggable module 106 (shown in FIG. 1) is configured to mate with the upper shroud 210. The lower shroud 212 is aligned with the lower module channel 118 when assembled. As such, the lower pluggable module 106 (shown in phantom in FIG. 8) is configured to mate with the lower shroud 212. The module circuit boards 188 (shown in phantom in FIG. 8) of the pluggable modules 106 are received in the card slot 214, 216 to mate with the contacts 220.

In an exemplary embodiment, the receptacle connector assembly 104 includes stop features used to locate the pluggable modules 106 in the module channels 116, 118. The stop features stop loading of the pluggable modules 106 into the module channels 116, 118. The stop features prevent overloading of the pluggable modules 106 into the module channels 116, 118. As such, the stop features prevent loading stresses on the electrical connector assembly 112. For example, rather than the pluggable modules 106 pressing against the electrical connector assembly 112, the pluggable modules 106 are loaded into the module channels 116, 118 until the pluggable modules 106 bottom out against the stop features.

In an exemplary embodiment, the receptacle cage 110 includes an upper module stop 160 defining the stop feature for the upper pluggable module 106. The upper module stop 160 extends into the upper module channel 116. The upper module stop 160 may be stamped and formed from the top wall 130. For example, the upper module stop 160 is stamped from the top wall 130 and bent inward into the upper module channel 116 at a predetermined position. The upper module stop 160 includes a stop surface 162. The stop surface 162 is forward facing and configured to interface with the upper pluggable module 106 when the upper pluggable module 106 is loaded into the upper module channel 116. The stop surface 162 is located at a predetermined depth from the front of the receptacle cage 110 (and/or a predetermined depth from the rear of the receptacle cage 110). In the illustrated embodiment, the upper module stop 160 extends generally perpendicular from the top wall 130. The upper module stop 160 is configured to engage the mating end 182 (shown in FIG. 3) of the pluggable module 106 and prevent further loading of the pluggable module 106 into the upper module channel 116. The upper module stop 160 is used to locate the upper pluggable module 106 in the upper module channel 116.

The lower module stop 300 defines the stop feature for the lower pluggable module 106. The lower module stop 300 extends into the lower module channel 118 from the front of the housing 200 of the electrical connector assembly 112. Because the lower module channel 118 is remote from the top wall 130, it would be difficult to form the stop feature for the lower pluggable module 106 from the top wall 130. Additionally, because the channel separator 142 stops short of the electrical connector assembly 112, it would be difficult to form the stop feature for the lower pluggable module 106 from the channel separator 142. In an exemplary embodiment, the lower module stop 300 is coupled to the housing 200 and extends forward from the front of the housing 200 to position the stop surface 322 at a predetermined depth from the front of the receptacle cage 110. The stop surface 322 is forward facing end configured to interface with the lower pluggable module 106 when the lower pluggable module 106 is loaded into the lower module channel 118. In an exemplary embodiment, the stop surface 322 is generally aligned with the stop surface 162 of the upper module stop 160. For example, the stop surface 322 may be co-planer with the stop surface 162. The lower module stop 300 is used to locate the lower pluggable module 106 in the lower module channel 118.

In an exemplary embodiment, the lower module stop 300 is configured to engage the receptacle cage 110. For example, the lower module stop 300 may be coupled to the side walls 134 of the receptacle cage 110. The forces from the lower pluggable module 106 engaging the lower module stop 300 are transferred from the lower module stop 300 to the side walls 134 of the receptacle cage 110. For example, the mounting arms 330, 332 (shown in FIG. 6) transfer the loading forces to the side walls 134 of the receptacle cage 110. As such, minimal loading forces are transferred to the housing 200 or the contacts 220. As such, the solder interfaces between the contacts 220 and the circuit board 102 are not overstressed by the loading forces of loading the lower pluggable module 106.

Figure 9:
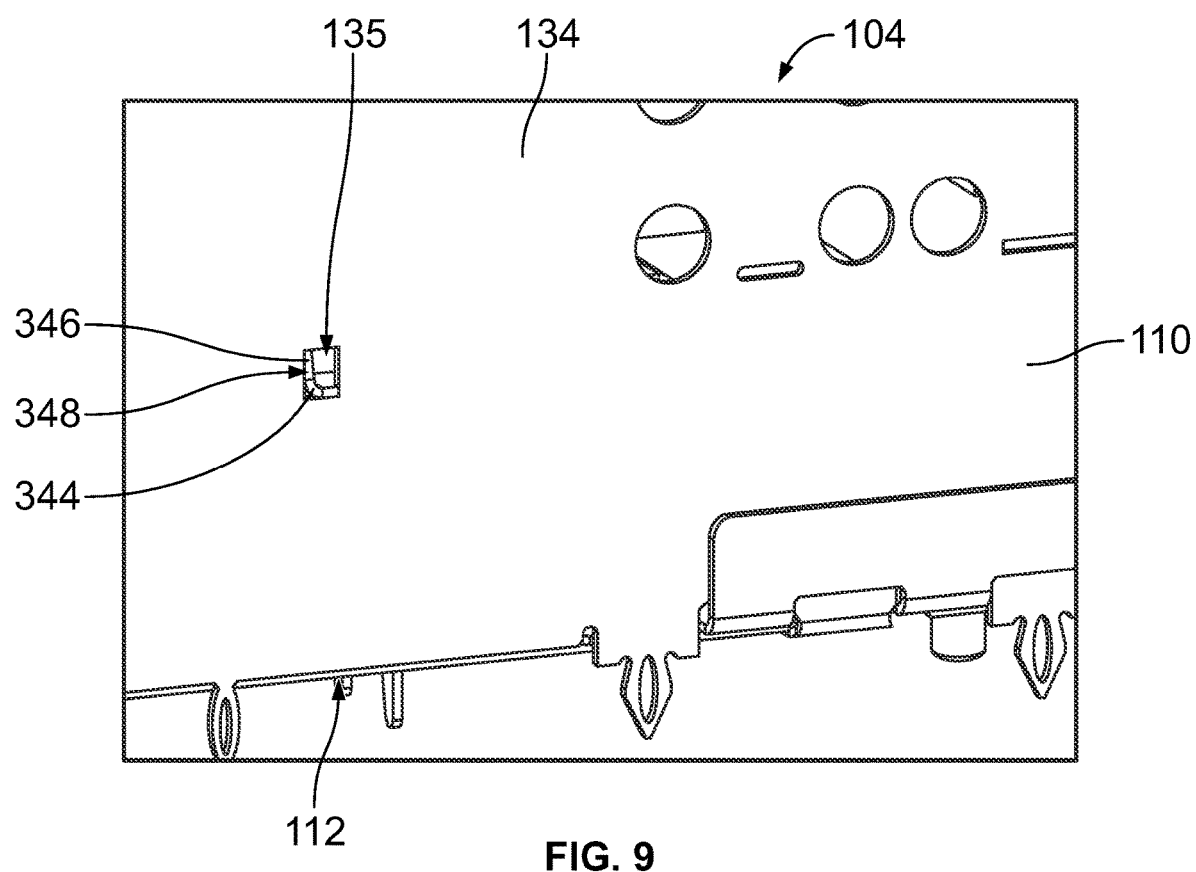
FIG. 9 is a perspective view of a portion of the receptacle connector assembly 104 in accordance with an exemplary embodiment.

FIG. 9 is a perspective view of a portion of the receptacle connector assembly 104 in accordance with an exemplary embodiment showing the lower module stop 300 coupled to the receptacle cage 110. During assembly, the receptacle cage 110 is lowered over the electrical connector assembly 112 to mount the receptacle cage 110 to the circuit board 102. As the receptacle cage 110 is lowered over the electrical connector assembly 112, the mounting arm 332 (and the mounting arm 330 shown in FIG. 6) is deflected inward. For example, the bottom edge of the side wall 134 rides along the ramp 346 to deflect the mounting arm 332 inward.

In an exemplary embodiment, the receptacle cage 110 includes mounting openings 135 in the side walls 134. The mounting tab 344 of the mounting arm 332 is received in the mounting opening 135. For example, when the mounting tab 344 is aligned with the mounting opening 135, the mounting arm 332 snaps outward to load the mounting tab 344 into the mounting opening 135. The stop surface 348 engages the rear edge defining the mounting opening 135. When the lower module stop 300 is pushed rearward by the pluggable module 106, the rearward loading force is transferred from the mounting arm 332 to the receptacle cage 110. The stop surface 348 is pressed against the receptacle cage 110 in the mounting opening 135 two resists rearward movement of the lower module stop 300. As such, the lower module stop 300 is fixed relative to the receptacle cage 110 and does not move rearward when the pluggable module 106 is pressed against the lower module stop 300.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A receptacle connector assembly comprising:
   a receptacle cage configured to be mounted to a circuit board, the receptacle cage having walls including a top wall, a rear wall and side walls defining a cavity, the cavity including an upper module channel configured to receive an upper pluggable module and a lower module channel configured to receive a lower pluggable module, the receptacle cage having a channel separator between the upper module channel and the lower module channel, the receptacle cage having an upper module stop extending into the upper module channel to locate the upper pluggable module in the upper module channel; and
   an electrical connector assembly configured to be mounted to the circuit board, the electrical connector assembly received in the cavity proximate to the rear wall, the electrical connector assembly includes a housing holding upper contacts and lower contacts, the housing having an upper card slot and a lower card slot, the upper contacts arranged in the upper card slot for mating with an upper circuit card of the upper pluggable module, the lower contacts arranged in the lower card slot for mating with a lower circuit card of the lower pluggable module, the electrical connector assembly including a lower module stop extending forward from the housing to locate the lower pluggable module in the lower module channel.

2. The receptacle connector assembly of claim 1, wherein the lower module stop is separate and discrete from and spaced apart from the channel separator.

3. The receptacle connector assembly of claim 1, wherein the lower module stop is loaded into the cavity with the electrical connector assembly.

4. The receptacle connector assembly of claim 1, wherein the lower module stop includes a front stop tab located forward of and spaced from a front wall of the housing.

5. The receptacle connector assembly of claim 1, wherein the lower module stop includes a front stop tab, the front stop tab located a stop depth from a front of the receptacle cage, the upper module stop located at the stop depth from the front of the receptacle cage.

6. The receptacle connector assembly of claim 1, wherein the lower module stop includes a front stop tab having a stop surface, the stop surface being coplanar with a stop surface of the upper module stop.

7. The receptacle connector assembly of claim 1, wherein the housing includes a front wall, the housing having an upper shroud extending forward from the front wall, the upper shroud forming the upper card slot, the housing including a lower shroud extending forward from the front wall, the lower shroud forming the lower card slot, the lower module stop located between the upper shroud and the lower shroud.

8. The receptacle connector assembly of claim 7, wherein the lower module stop includes a stop surface located forward of the front wall and rearward of a front surface of the lower shroud.

9. The receptacle connector assembly of claim 1, wherein the lower module stop includes a main body coupled to the housing, the lower module stop including a first mounting arm extending from the main body and a second mounting arm extending from the main body, the first mounting arms coupled to one of the side walls of the receptacle cage, the second mounting arm coupled to one of the side walls of the receptacle cage.

10. The receptacle connector assembly of claim 9, wherein the housing includes a first groove at a first side and a second groove at a second side, the first mounting arm being received in the first groove, the second mounting arm being received in the second groove.

11. The receptacle connector assembly of claim 9, wherein the first mounting arm includes a first mounting tab at a distal end of the first mounting arm, the first mounting tab including a first stop shoulder, the first stop shoulder received in an opening of the corresponding side wall of the receptacle cage to fix the lower module stop relative to the receptacle cage, and wherein the second mounting arm includes a second mounting tab at a distal end of the second mounting arm, the second mounting tab including a second stop shoulder, the second stop shoulder received in an opening of the corresponding side wall of the receptacle cage to fix the lower module stop relative to the receptacle cage.

12. An electrical connector assembly for electrically connecting upper and lower pluggable modules to a circuit board, the electrical connector assembly comprising:
a housing having a bottom configured to be mounted to the circuit board, the housing having a front wall, an upper shroud extending forward of the front wall and a lower shroud extending forward of the front wall, the upper shroud configured to mate with the upper pluggable module, the lower shroud configured to mate with the lower pluggable module, the upper shroud having an upper card slot, the lower shroud having a lower card slot;
upper contacts held by the housing, the upper contacts arranged in the upper card slot for mating with an upper circuit card of the upper pluggable module,
lower contacts held by the housing, the lower contacts arranged in the lower card slot for mating with a lower circuit card of the lower pluggable module; and
a lower module stop coupled to the front wall and extending forward from the front wall to a front stop tab, the front stop tab located a stop distance from the front wall to locate the lower pluggable module relative to the front wall.

13. The electrical connector assembly of claim 12, wherein the lower module stop includes a stop surface located forward of the front wall and rearward of a front surface of the lower shroud.

14. The electrical connector assembly of claim 12, wherein the lower module stop includes a main body coupled to the housing, the lower module stop including a first mounting arm extending from the main body and a second mounting arm extending from the main body, the first mounting arms coupled to one of the side walls of the receptacle cage, the second mounting arm coupled to one of the side walls of the receptacle cage.

15. The electrical connector assembly of claim 14, wherein the housing includes a first groove at a first side and a second groove at a second side, the first mounting arm being received in the first groove, the second mounting arm being received in the second groove.

16. The electrical connector assembly of claim 14, wherein the first mounting arm includes a first mounting tab at a distal end of the first mounting arm, the first mounting tab including a first stop shoulder, the first stop shoulder received in an opening of the corresponding side wall of the receptacle cage to fix the lower module stop relative to the receptacle cage, and wherein the second mounting arm includes a second mounting tab at a distal end of the second mounting arm, the second mounting tab including a second stop shoulder, the second stop shoulder received in an opening of the corresponding side wall of the receptacle cage to fix the lower module stop relative to the receptacle cage.

17. A receptacle connector assembly comprising:
a receptacle cage configured to be mounted to a circuit board, the receptacle cage having walls including a top wall, a rear wall and side walls defining a cavity, the receptacle cage including a mounting opening in at least one of the side walls, the cavity including an upper module channel configured to receive an upper pluggable module and a lower module channel configured to receive a lower pluggable module, the receptacle cage having a channel separator between the upper module channel and the lower module channel, the receptacle cage having an upper module stop extending into the upper module channel to locate the upper pluggable module in the upper module channel, the upper module stop located at a stop depth from a front of the receptacle cage; and
an electrical connector assembly configured to be mounted to the circuit board, the electrical connector assembly received in the cavity proximate to the rear wall, the electrical connector assembly includes a housing holding upper contacts and lower contacts, the housing having an upper card slot and a lower card slot, the upper contacts arranged in the upper card slot for mating with an upper circuit card of the upper pluggable module, the lower contacts arranged in the lower card slot for mating with a lower circuit card of the lower pluggable module, the electrical connector assembly including a lower module stop extending forward from the housing to locate the lower pluggable module in the lower module channel, the lower module stop includes a main body coupled to the housing, the lower module stop includes a front stop tab extending from the main body, the front stop tab located at the stop depth from the front of the receptacle cage, the lower module stop including a mounting arm extending from the main body, the mounting arm being received in the mounting opening and engaging the receptacle cage to locate the lower module stop relative to the receptacle cage.

18. The receptacle connector assembly of claim 17, wherein the front stop tab is located forward of and spaced from a front wall of the housing.

19. The receptacle connector assembly of claim 17, wherein the housing includes a groove at a first side, the mounting arm being received in the groove.

20. The receptacle connector assembly of claim 17, wherein the mounting arm includes a mounting tab at a distal end of the mounting arm, the mounting tab including a stop shoulder, the stop shoulder received in the mounting opening of the corresponding side wall of the receptacle cage to fix the lower module stop relative to the receptacle cage.

* * * * *